United States Patent [19]

Hirakawa et al.

[11] Patent Number: 4,878,105
[45] Date of Patent: Oct. 31, 1989

[54] SEMICONDUCTOR DEVICE HAVING WIRING LAYER COMPOSED OF SILICON FILM AND ALUMINUM FILM WITH IMPROVED CONTACT STRUCTURE THEREOF

[75] Inventors: Noboru Hirakawa; Yasukazu Inoue, both of Tokyo, Japan

[73] Assignee: NEC Corporation, Tokyo, Japan

[21] Appl. No.: 196,389

[22] Filed: May 20, 1988

[30] Foreign Application Priority Data

May 21, 1987 [JP] Japan .................................. 62-125221

[51] Int. Cl.⁴ ..................... H01L 29/34; H01L 29/04; H01L 23/48
[52] U.S. Cl. ....................................... 357/59; 357/54; 357/65; 357/71
[58] Field of Search .................... 357/59, 23.9, 54, 65, 357/71

[56] References Cited

U.S. PATENT DOCUMENTS

| | | | |
|---|---|---|---|
| 3,881,971 | 5/1975 | Greer et al. | 357/59 |
| 3,913,126 | 10/1975 | Hooker et al. | 357/59 |
| 4,239,559 | 12/1980 | Ito | 347/59 |
| 4,514,747 | 4/1985 | Miyata et al. | 357/90 |
| 4,549,199 | 10/1988 | Yamauchi et al. | 357/59 |
| 4,712,125 | 12/1987 | Bhatia et al. | 357/59 |

*Primary Examiner*—J. Carroll
*Attorney, Agent, or Firm*—Helfgott & Karas

[57] ABSTRACT

A semiconductor device having a wiring layer composed of a polycrystalline silicon film and an aluminum film is disclosed. The wiring layer is provided on an insulating layer with the silicon film and the aluminum film formed on and having the same pattern with the silicon film, and the aluminum film is directly contacted to an impurity region of a substrate without interposing the silicon film.

8 Claims, 3 Drawing Sheets

SEMICONDUCTOR DEVICE HAVING WIRING LAYER COMPOSED OF SILICON FILM AND ALUMINUM FILM WITH IMPROVED CONTACT STRUCTURE THEREOF

BACKGROUND OF THE INVENTION

The present invention relates to a semiconductor device having a wiring layer composed of a silicon film and an aluminum film with an improved contact structure thereof.

A wiring layer made of pure aluminum or silicon-aluminum alloy is apt to break by moisture on an insulating layer. To avoid this disadvantage, a wiring layer composed of a doped polycrystalline silicon film attached to the insulating layer and an aluminum film provided on the silicon film and having the same shape with the under silicon film has been proposed. However, the prior art structure has a high contact resistance because in the contact hole the doped polycrystalline silicon film is interposed entirely between the aluminum film and an impurity region of the monocrystalline silicon substrate.

SUMMARY OF THE INVENTION

Accordingly, an object of the present invention is to provide a semiconductor device in which a wiring layer is hardly broken by moisture and ohmicly contacted to an impurity region of the substrate with a low contact resistance.

According to a feature of the present invention, there is provided a semiconductor device which comprises a monocrystalline silicon substrate having a major surface and an impurity region, an insulating layer formed on the major surface of the substrate and having a contact hole to expose a part of the impurity region of the substrate, and a wiring layer formed on the insulating layer and contacted to the part of the substrate. The wiring layer includes a first polycrystalline silicon film doped with impurity atoms and provided on the upper surface of the insulating layer, a second polycrystalline silicon doped with impurity atoms and provided on the side of the insulating layer in the contact hole, and an aluminum film formed on the first polycrystalline silicon film above the upper surface of the insulating film with the same shape as the first polycrystalline silicon film, formed on the second polycrystalline silicon film above the side of the insulating layer within the contact hole and directly contacted to the part of the impurity region of the substrate within the contact hole. The aluminum film may be of pure aluminum. A small amount of silicon atoms may be contained therein, provided that the silicon content is 1.0% or less in weight. Also in each of the first and second polycrystalline films, a small amount of aluminum may be contained, with the aluminum content being 0.1% or less in weight. Further, in order to prevent the silicon films from disappearing by being alloyed with the aluminum film formed thereon, the impurity (phosphorus, arsenic or boron) concentration of the silicon films are favorably $10^{20}$ atoms/cm$^3$ or more and their thickness is 1000 Å or more. For ease of the patterning process thereof, the thickness is favorably 3000 Å or less. The moisture problem on the insulating layer can be eliminated by providing the first silicon film, or else on the side in the contact hole by the second silicon film. The feature of the second silicon film in the contact hole can realize a low contact resistance connection of the wiring layer because the aluminum film is directly contacted to the impurity region of the substrate. The second silicon film may be contacted to the impurity region at the periphery of the contact hole. The second silicon film may be used as a silicon source to avoid an alloy-spike causing in the PN junction of the impurity region by connecting the aluminum film. Namely, the second silicon film must be designed its shape including the thickness and its impurity concentration to eliminate the moisture problem at the side of the contact hole, to realize the low contact resistance of the wiring layer and to avoid the alloy-spike phenomenon. If the necessary conditions in the second silicon film coincide with those of the first silicon film, both of silicon films may be continuously formed each other. On the other hand, if the necessary conditions in first and second silicon films are different from each other, these silicon films may be separated by interposing a thin insulating film therebetween. When the conductivity type of the second silicon film is opposite to the impurity region of the substrate in CMOS structure, for example, the second silicon film may be separated from the impurity region by interposing a thin insulating film therebetween.

DESCRIPTION OF THE PRIOR ART

Figure 1:
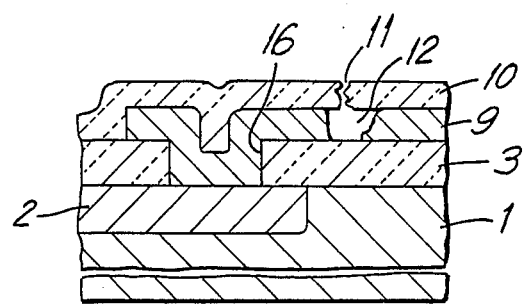
FIG. 1 is a cross-sectional view showing a semiconductor device of a prior art.

Referring to FIG. 1, a wiring layer 9 of pure aluminum or silicon-aluminum alloy is formed on an insulating layer 3 on a monocrystalline silicon substrate 1 of one conductivity type and contacted to an impurity region 2 of a conductivity type opposite to the substrate formed in the substrate through a contact hole 16, and an insulating film 10 as a passivation film covers the wiring layer 9. When a pin-hole 11 exists in the passivation film 10, the wiring layer 9 is gradually corroded by phosphoric acid which is generated by moisture passing through the pin-hole 11 and phosphorus atoms existing in the insulating film 10 and/or in the insulating layer 3. Finally, a cavity 12 is formed in the entire thickness of the wiring layer 9 by the corrosion and the electrical connection of the wiring layer 9 becomes impossible.

Figure 2:
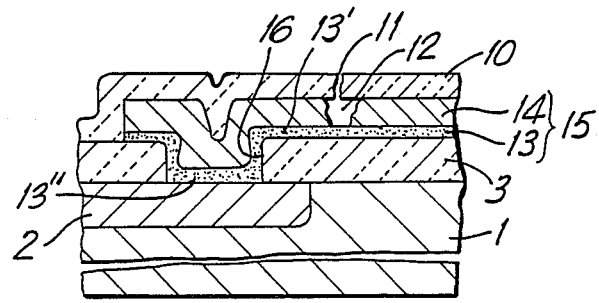
FIG. 2 is a cross-sectional view showing a semiconductor device of a prior art.
Figure 3B:
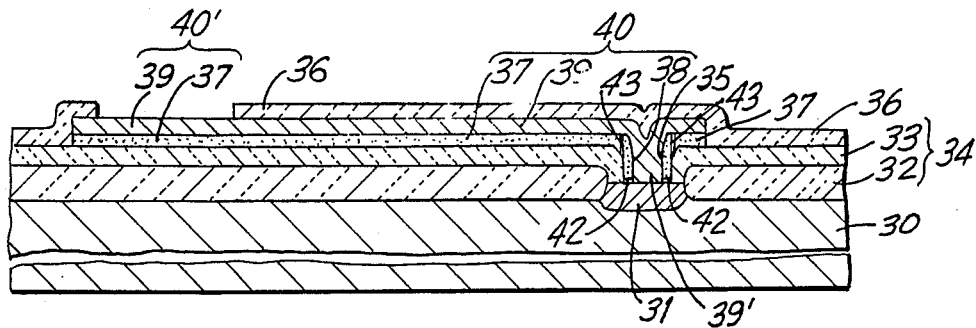
FIGS. 3B, 3C and 3D are cross-sectional views taken along lines B—B′, C—C′ and D—D′ in FIG. 3A as viewed in the directions of arrows, respectively.
Figure 3A:
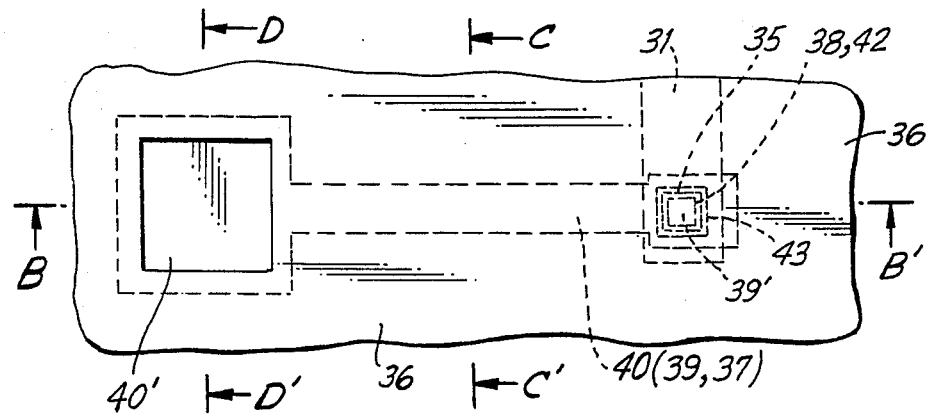
FIG. 3A is a plan view showing an embodiment of the present invention.
Figure 3D:
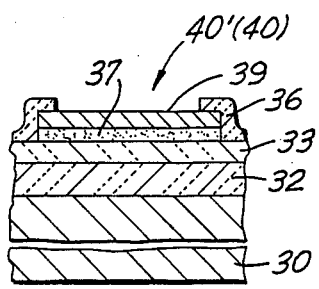
Figure 3C:
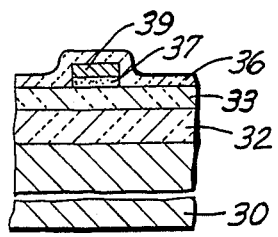

Referring to FIG. 2, a wiring layer 15 includes a polycrystalline silicon film 13 doped with impurities of P-type when the impurity region 2 is of P-type and N-type when the impurity region 2 is of N-type, and an aluminum film 14 on the silicon film 13. In this case, even if the cavity 12 by the corrosion mentioned above is formed in the entire thickness of the aluminum film 14, a part 13′ of the silicon film 13 remains under the cavity 12, and therefore, the electrical connection is possible through the remaining part of the silicon film 13. However, in the prior art structure, the doped polycrystalline silicon film 13 is provided in the contact hole 16. Namely, the part 13" of the doped polycrystalline silicon film 13 is provided in the contact hole such that the exposed area of the impurity region 2 of monocrystalline silicon is entirely covered by the doped polycrystalline silicon film 13" and the aluminum film 14 is provided on the polycrystalline silicon film 13". In the contact structure, so called silicon nodule phenomenon is apt to occur, and therefore, the contact electrical resistance becomes unfavorably a high level. The silicon nodule phenomenon is that silicons are dispersed from the polycrystalline silicon film 13" doped with impurities and contacted to the monocrystalline silicon substrate into the aluminum film 14 above the film 13" and re-crystallized to form large silicon grains, that is, silicon nodules in the portion of the aluminum film 13 within or on the contact hole 16. The phenomenon is more serious when the contact hole 16 is miniaturized and borons are doped in the silicon film 13.

DESCRIPTION OF EMBODIMENTS

Referring to FIGS. 3A to 3D, an embodiment of the present invention is disclosed. On a major surface of a P-type monocrystalline silicon substrate 30 a field silicon oxide film 32 is selectively formed, and an N-type impurity region 31 is formed by using the field silicon oxide film 32 as a mask. A phosphosilicate glass film 33 is entirely formed and provides a contact hole 35 of a rectangular plan shape to expose a part of the impurity region 31. The field silicon oxide film 32 and the phosphosilicate glass film 33 constitute an insulating layer 34. A wiring layer 40 having a bonding pad 40' is provided on the insulating layer 34 and contacted to the part of the impurity region 31 within the contact hole 35. The wiring layer 40 includes a first polycrystalline silicon film 37 doped with impurities of phosphorus, arsenic or boron and formed on the upper surface of the insulating layer 34, a second polycrystalline silicon film 38 doped with impurities of phosphorus, arsenic or boron, formed on the all sides of the insulating layer 34 within the contact hole 35 and having a ring plan shape, and an aluminum film 39 formed on the first silicon film 37 above the upper surface of the insulating layer 34 with the same plan shape pattern as the first silicon film 37, formed on the second polycrystalline silicon film 38 above the sides of the insulating layer 34 within the contact hole and contacted directly to the part of the impurity region 31 within the contact hole without interposing the silicon film. Further, a thin insulating film 42 having a ring plan shape is provided under the second silicon film 38 to separate it from the impurity region 31, and a thin insulating film 43 having a ring plan shape is provided between first and second silicon films 37, 38 to separate these silicon films each other.

Referring to FIGS. 4A to 4D, a method of manufacturing an embodiment will be explained. Although some components in FIGS. 4A to 4D are somewhat modified from those in FIGS. 3A to 3D, substantially the same components as those in FIGS. 3A to 3D are indicated by the same reference numerals.

Figure 4A:
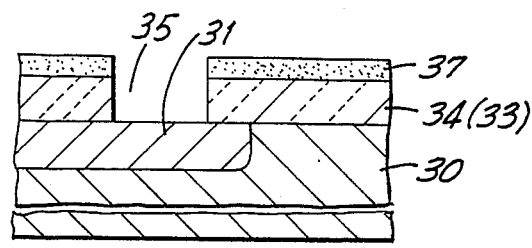
FIGS. 4A to 4D are cross-sectional views showing a method of manufacturing an embodiment of the present invention, in sequence.

After forming the N-type impurity region 31 in the P-type monocrystalline silicon substrate 1, the insulating film 33 of 0.3 to 0.7 μm thickness which constitutes the insulating layer 34 is entirely deposited. Next, the first polycrystalline silicon film 37 of 0.2 μm thickness doped with phosphorus is formed on the insulating layer 34, and the sheet resistivity of the first silicon film 37 is about 40 Ω/□. Next, the first silicon film 37 and the insulating layer 34 are selectively etched in sequence to form the contact hole 35. (FIG. 4A)

Figure 4B:
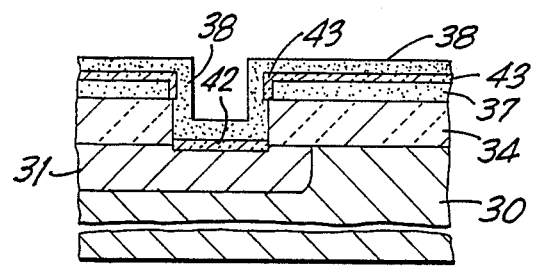

Thereafter, by conducting a heat treatment at 900° C. under oxygen atmosphere, the silicon oxide film 42 of 10 to 20 nm thickness is formed at the surface of the impurity region 31 within the contact hole 35 and the silicon oxide film 43 of 20 to 40 nm thickness is formed at the upper and side surfaces of the first polycrystalline silicon film 37. Then, the second polycrystalline silicon film 38 of 0.2 μm thickness doped with phosphorus is entirely formed. Owing to the silicon oxide film 42 the phosphorus in the second silicon film 38 can be prevented to introduce into the impurity region 31. (FIG. 4B)

Figure 4C:
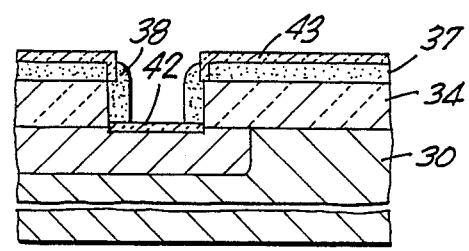

Next, by conducting anisotropic etching the parts of the second silicon film 38 on the upper surface of the silicon oxide film 43 above the first silicon film 37 and on the center of the silicon oxide film 42 are selectively etched away so as to remain the parts of the second silicon film 38 adjacent to the side of the contact hole and on the periphery of the silicon oxide film 42. The remaining second polycrystalline silicon film 38 forms a plan ring shape. (FIG. 4C)

Figure 4D:
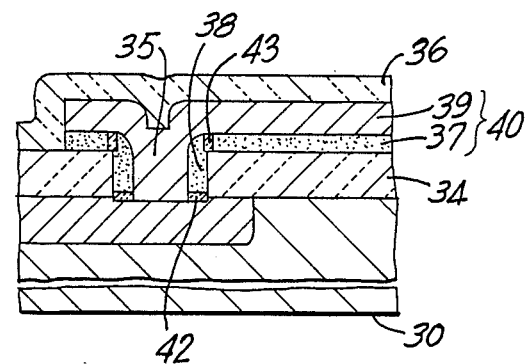

Thereafter, by conducting anisotropic etching the exposed silicon oxide film 43 on the upper surface of the first silicon film 37 and the exposed center portion of the silicon oxide film 42 are etched away, and the part of the silicon oxide film 43 between the first and second remaining silicon films 37, 38 and the part of the silicon oxide film 42 under the remaining second silicon film 38 only remain. Then, an aluminum layer 39 of 1 μm thickness are entirely deposited on the exposed upper surface of the first silicon film 37 above the insulating layer 34, on the exposed second silicon film 38 within the contact hole 35 and on the exposed section of the impurity region 31 within the contact hole 35. Thereafter, the aluminum layer 39 and the first silicon film 37 are selectively etched in sequence in the same plan pattern each other to form the wiring layer 40. Finally, the passivation film 36 is entirely deposited and the bonding pad region 40' (FIG. 3) of the wiring layer 40 is selectively exposed. . . . FIG. 4D

What is claimed is:

1. A semiconductor device, comprising a monocrystalline silicon substrate having a major surface and an impurity region, an insulating layer formed on said major surface of said substrate and having an upper surface, said insulating layer being provided with a contact hole such that said contact hole is formed by an enclosing side wall made of said insulating layer and that said contact hole exposes part of said impurity region of said substrate, a thin insulating film having a ring plan shape and formed on a peripheral portion of said part of said impurity region within said contact hole, said thin insulating film having an upper surface, and a wiring layer formed on said insulating layer and electrically connected to said part of said impurity region, said wiring layer including a first polycrystalline silicon film doped with impurity atoms and formed on said upper surface of said insulating layer, said first polycrystalline silicon film having a first section having a first width and a second section having a second width greater than said first width and being formed continually with said first section of said first polycrystalline silicon film, a second polycrystalline silicon film doped with impurity atoms and having a ring plan shape and formed on said side wall made of said insulating layer and on said thin insulating film within said contact hole, and an aluminum film having first, second and third sections, said first section of said aluminum film having a width equal to said first width and being formed just on and in contact with said first section of said first polycrystalline silicon film, said second section of said aluminum film having a width equal to said second width and being formed continually with said first section of said aluminum film and being formed just on and in contact with said second section of said first polycrystalline silicon film to form a bonding pad with said second section of said first polycrystalline silicon film, and said third section of said aluminum film being formed continually with said first section of said aluminum film and being formed on said second polycrystalline silicon film and directly in contact with a center portion of said part of said impurity region enclosed by said peripheral portion within said contact hole.

2. A semiconductor device of claim 1, in which said first and second polycrystalline silicon films are separated from each other by a thin insulating film provided therebetween.

3. A semiconductor device of claim 1, in which said first polycrystalline silicon film has the thickness from said upper surface of said insulating layer ranging from 1000 Å to 3000 Å.

4. A semiconductor device of claim 1, in which said second polycrystalline silicon film has the thickness from said side of said contact hole ranging from 1000 Å to 3000 Å.

5. A semiconductor device of claim 1, in which said first polycrystalline silicon film has the impurity concentration of $10^{20}$ atoms/cm$^3$ or more.

6. A semiconductor device of claim 1, in which said second polycrystalline silicon film has the impurity concentration of $10^{20}$ atoms/cm$^3$ or more.

7. A semiconductor device of claim 1, in which said first and second polycrystalline silicon film are the same conductivity type as said impurity region.

8. A semiconductor device of claim 1, in which said second polycrystalline silicon film is a conductivity type opposite to said impurity region.

* * * * *